United States Patent
Lazzari et al.

(10) Patent No.: US 8,420,171 B2
(45) Date of Patent: Apr. 16, 2013

(54) FORMING HEATERS FOR PHASE CHANGE MEMORIES

(75) Inventors: Carla Maria Lazzari, Casatenovo (IT); Silvia Borsari, Milan (IT)

(73) Assignee: Micron Technology, Inc., Boise, ID (US)

(*) Notice: Subject to any disclaimer, the term of this patent is extended or adjusted under 35 U.S.C. 154(b) by 280 days.

(21) Appl. No.: 12/944,134

(22) Filed: Nov. 11, 2010

(65) Prior Publication Data

US 2012/0121864 A1    May 17, 2012

(51) Int. Cl.
    *B32B 3/10*    (2006.01)
(52) U.S. Cl.
    USPC ........... 427/256; 438/95; 438/381; 29/611; 29/852
(58) Field of Classification Search ........ 29/611, 29/852; 428/622, 628, 644, 654, 677; 427/58, 427/256
    See application file for complete search history.

(56) References Cited

U.S. PATENT DOCUMENTS

| 2006/0257787 A1* | 11/2006 | Kuo et al. ............... 430/270.13 |
| 2008/0061282 A1* | 3/2008 | Sato et al. ................... 257/4 |

* cited by examiner

*Primary Examiner* — Michael Cleveland
*Assistant Examiner* — Tabassom Tadayyon Eslami
(74) *Attorney, Agent, or Firm* — Dorsey & Whitney LLP

(57) ABSTRACT

A heater for a phase change memory may be formed by depositing a first material into a trench such that the material is thicker on the side wall than on the bottom of the trench. In one embodiment, because the trench side walls are of a different material than the bottom, differential deposition occurs. Then a heater material is deposited thereover. The heater material may react with the first material at the bottom of the trench to make Ohmic contact with an underlying metal layer. As a result, a vertical heater may be formed which is capable of making a small area contact with an overlying chalcogenide material.

11 Claims, 2 Drawing Sheets

FORMING HEATERS FOR PHASE CHANGE MEMORIES

BACKGROUND

This relates generally to phase change memories.

Phase change memories use a chalcogenide layer that changes phase between more amorphous and less amorphous or more crystalline phases. Generally, the phase transition is the result of Joule heating of the chalcogenide layer.

In some cases, the heating of the chalcogenide layer is due to electrical heating through a heating element proximate to the phase change material layer.

DETAILED DESCRIPTION

In accordance with some embodiments, differential deposition can be used to form vertical high aspect ratio heaters for phase change memories. The vertical heaters may be more effective because they have a smaller point of contact with the chalcogenide material, that point of contact determined by the thickness in the horizontal dimension of the phase change material heater, which is deposited as a layer in the vertical direction.

Therefore, the heater can have a critical dimension thinner than any thickness possible with lithographic techniques. As a result of the thin area of contact between the heater and the phase change material layer, less material in the phase change layer must be required to change phase and, therefore, less energy is needed to make the phase transition. As a result, power consumption may be improved in some embodiments.

Figure 1:
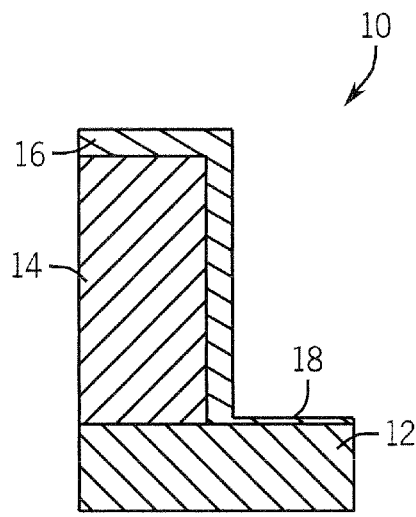
FIG. 1 is an enlarged, partial, cross-sectional view of one embodiment of the present invention at an early stage.

Referring to FIG. 1, in some embodiments, a vertical wall dielectric 14 may be formed. In some cases, the dielectric 14 may be formed with a trench, FIG. 1 only showing the left side of a trench. The dielectric 14, in one embodiment, may be stacked oxide and nitride layers. However, any dielectric may be utilized. The dielectric 14 is formed on top of a metal layer 12 which acts as a conductor, lower electrode, or address line.

In some embodiments, a deposition technique is used to form a layer composed of a thicker vertical portion 16 on the dielectric 14 and a thinner horizontal portion 18 on the metal 12. The difference in deposition thickness is the result of the differential deposition that occurs on metal, compared to dielectric materials. Specifically, with some deposition processes, such as atomic layer deposition, more material is deposited on dielectrics than on metals. For example, in a flow of boron $B_2H_6$, the boron is well physisorbed on an oxide/nitride layer 14 and less effectively physisorbed on metals, resulting in differential thicknesses. Another technique that can be utilized is $SiH_4$ deposition, however, the film performance may not be as good as that achieved with boron.

Figure 2:
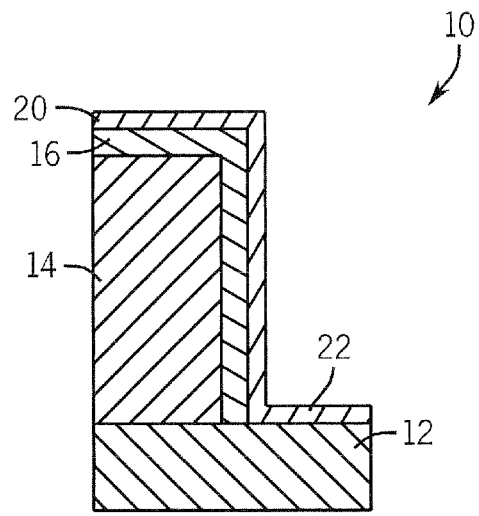
FIG. 2 is an enlarged, cross-sectional view at a subsequent stage according to one embodiment.

Next, a heater material 20 is deposited, as indicated in FIG. 2, using a deposition technique, such as atomic layer deposition. For example, the atomic layer deposition of tungsten may be used to form the heater material 20 which has a vertical portion and a horizontal portion 22. However, the horizontal portion 18 on the metal 12 is consumed during the heater material 20 deposition process. As a result, physical contact is achieved between the heater material 20 and the metal 12.

Figure 3:
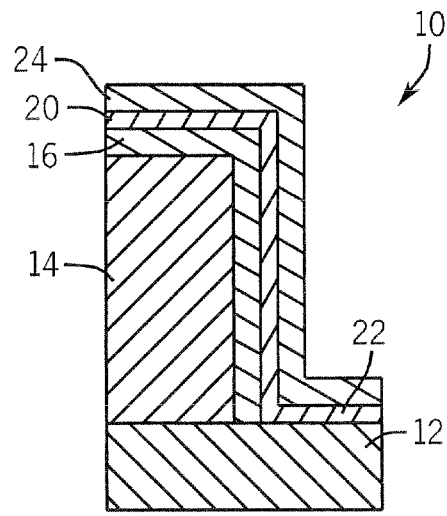
FIG. 3 is an enlarged, cross-sectional view at still a subsequent stage in accordance with one embodiment.

Next, a second boron layer may be deposited, again, using $B_2H_6$ flow, in one embodiment, to form the capping layer 24, as shown in FIG. 3. Again, atomic layer deposition may be used, for example.

More specifically, the reason for the consumption of the boron forming the horizontal portion 18 at the bottom of the trench is that tungsten fluoride ($WF_6$) reacts with any boron at the metal surface, achieving Ohmic contact to the metal surface. Good adhesion between the tungsten based layer and the dielectric 14 is guaranteed by the residual of boron deposited on the dielectric and still remaining on the dielectric 14. The second $B_2H_6$ atomic layer caps the in situ heater material 20.

Figure 4:
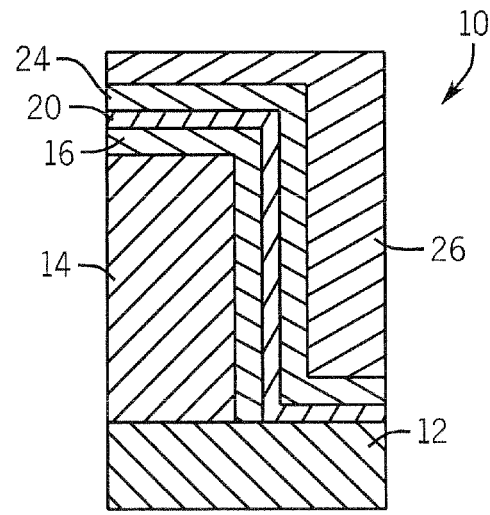
FIG. 4 is an enlarged, cross-sectional view at a subsequent stage in accordance with one embodiment.
Figure 5:
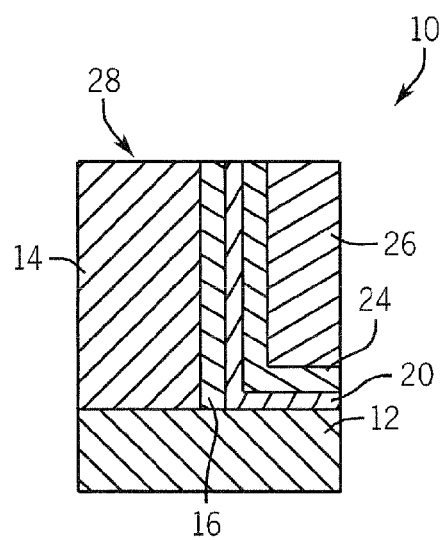
FIG. 5 is an enlarged, cross-sectional view at a subsequent stage according to one embodiment.

Next, as shown in FIG. 4, a dielectric layer 26 is blanket deposited over the structure and then planarized down to the upper surface 28 of the dielectric 14, as shown in FIG. 5.

Figure 6:
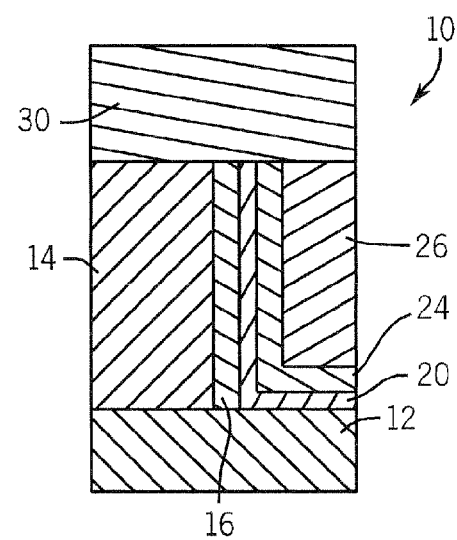
FIG. 6 is an enlarged, cross-sectional view at a subsequent stage according to one embodiment.

Finally, a chalcogenide layer 30 is deposited, as indicated in FIG. 6. The vertical heater material 20 makes a small area or point contact with the chalcogenide layer 30. Thereafter, the chalcogenide layer may be covered with additional layers, including another electrode or metal layer (not shown). Then, additional layers (also not shown) may be deposited, such as the layers forming an ovonic threshold switch, as one example.

In some embodiments, the surface area of contact between the vertically oriented heater material 20 and the chalcogenide layer 30 is governed by the thickness of the deposition of the heater material 20. Using atomic layer deposition, this layer can be made extremely small, resulting in a very small area of contact between the chalcogenide layer 30 and the heater material 20.

While the figures depict the formation of the single cell, a large number of cells may be formed at the same time, for example, by forming a plurality of spaced trenches in a dielectric 14. Then, in each trench, the layers shown in FIGS. 1-6 may be deposited and processed in the fashion indicated. As a result, a number of cells may be formed, initially, with a common chalcogenide layer 30. In some embodiments, the chalcogenide layer may then be singulated so that the chalcogenide layer is no longer continuous across the plurality of cells, but is distinct and constitutes a dot at each cell. Thus, a plurality of cells may be formed along a line, defined by the metal 12 and perpendicular lines may be defined by conductors extending transversely to the length of the metal 12, contacting the upper surface of the chalcogenide 30 after it has been singulated.

Programming to alter the state or phase of the material may be accomplished by applying voltage potentials to the address lines, thereby generating a voltage potential across a memory element including a phase change layer 30. When the voltage potential is greater than the threshold voltages of any select device and memory element, then an electrical current may flow through the phase change layer 30 in response to the applied voltage potentials, and may result in heating of the phase change layer 30 through the action of the heater 20.

This heating may alter the memory state or phase of the layer 30, in one embodiment. Altering the phase or state of the layer 30 may alter the electrical characteristic of memory material, e.g., the resistance or threshold voltage of the material may be altered by altering the phase of the memory material. Memory material may also be referred to as a programmable resistance material.

In the "reset" state, memory material may be in an amorphous or semi-amorphous state and in the "set" state, memory material may be in a crystalline or semi-crystalline state. The resistance of memory material in the amorphous or semi-amorphous state may be greater than the resistance of memory material in the crystalline or semi-crystalline state. It is to be appreciated that the association of reset and set with amorphous and crystalline states, respectively, is a convention and that at least an opposite convention may be adopted.

Using electrical current, memory material may be heated to a relatively higher temperature to melt and then quenched to vitrify and "reset" memory material in an amorphous state (e.g., program memory material to a logic "0" value). Heating the volume of memory material to a relatively lower crystallization temperature may crystallize or devitrify memory material and "set" memory material (e.g., program memory material to a logic "1" value). Various resistances of memory material may be achieved to store information by varying the amount of current flow and duration through the volume of memory material.

References throughout this specification to "one embodiment" or "an embodiment" mean that a particular feature, structure, or characteristic described in connection with the embodiment is included in at least one implementation encompassed within the present invention. Thus, appearances of the phrase "one embodiment" or "in an embodiment" are not necessarily referring to the same embodiment. Furthermore, the particular features, structures, or characteristics may be instituted in other suitable forms other than the particular embodiment illustrated and all such forms may be encompassed within the claims of the present application.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising: forming a heater for a phase change memory by differentially depositing a first material over a vertical surface and a horizontal surface by a single deposition step wherein deposition of the first material forms a layer on the vertical surface having a thickness that is greater than a thickness of a layer on the horizontal surface, and then depositing a heater material over the first material.

2. The method of claim 1 including using atomic layer deposition.

3. The method of claim 2 including using atomic layer deposition of boron.

4. The method of claim 3 including depositing the heater material on said first material and causing a reaction to occur between the first material and the heater material such that Ohmic contact is achieved between the heater material and the horizontal surface.

5. The method of claim 4 including forming the horizontal surface of metal and forming a vertical surface of dielectric and using a deposition process that deposits more of said first material on dielectric than on said metal.

6. The method of claim 5 including forming a vertical heater.

7. A method comprising:
    forming a layer on a vertical surface and a horizontal surface, the layer being thicker on said vertical surface than said horizontal surface;
    depositing a material to form a heater for a phase change memory on said layer; and
    causing the material to react with the layer on the horizontal surface so as to make physical contact with said horizontal surface.

8. The method of claim 7 including forming said layer of boron.

9. The method of claim 8 including forming the vertical surface of dielectric and forming the horizontal surface of metal.

10. The method of claim 7 including depositing a boron containing layer on said material to form a structure.

11. The method of claim 10 including planarizing said structure and depositing a chalcogenide in physical and electrical contact with said material.

* * * * *